United States Patent
Gumm

(10) Patent No.: US 6,930,563 B2
(45) Date of Patent: Aug. 16, 2005

(54) SELF-ADJUSTING I-Q MODULATOR SYSTEM

(75) Inventor: Linley F. Gumm, Beaverton, OR (US)

(73) Assignee: Tektronix, Inc, Beaverton, OR (US)

( * ) Notice: Subject to any disclaimer, the term of this patent is extended or adjusted under 35 U.S.C. 154(b) by 0 days.

(21) Appl. No.: 10/418,874

(22) Filed: Apr. 18, 2003

(65) Prior Publication Data

US 2004/0207478 A1 Oct. 21, 2004

(51) Int. Cl.[7] .................................................. H03K 7/00
(52) U.S. Cl. .................. 332/107; 342/174; 342/357.12; 375/296; 375/308; 332/145; 332/103
(58) Field of Search ................................ 332/107, 103, 332/145, 119; 375/296, 308, 261; 342/174, 357.12

(56) References Cited

U.S. PATENT DOCUMENTS

| | | |
|---|---|---|
| 4,717,894 A | 1/1988 | Edwards et al. |
| 5,119,399 A | 6/1992 | Santos et al. |
| 5,694,093 A | 12/1997 | DaSilva et al. |
| 6,574,286 B2 * | 6/2003 | McVey .................. 375/308 |

* cited by examiner

*Primary Examiner*—Arnold Kinkead
(74) *Attorney, Agent, or Firm*—Francis I. Gray

(57) ABSTRACT

An improved self-adjusting I-Q modulator system has a quadrature modulated carrier output that is input to a waveform acquisition circuit for obtaining a full waveform from which both amplitude and phase measurements are obtained. Calibration occurs by setting respective I and Q inputs to the multipliers to zero and adjusting corresponding variable offset voltages to null the modulated carrier output. Then a voltage reference is selected by each I and Q input path in turn, and the amplitude and phase of the modulated carrier output for each I and Q channel are measured. Respective phase shifters for a carrier signal are adjusted to move the outputs of the phase shifters toward a quadrature relationship in response to the measured amplitude and phase of the full waveform. These steps are repeated until the phases of the I and Q channels are in quadrature.

3 Claims, 2 Drawing Sheets

SELF-ADJUSTING I-Q MODULATOR SYSTEM

BACKGROUND OF THE INVENTION

The present invention relates to modulator systems, and more particularly to a self-adjusting I-Q modulator system that operates over a wide range of carrier frequencies.

I-Q modulators are used to simultaneously amplitude and phase modulate a carrier to produce QAM or other forms of modulation. The basic block diagram of an I-Q modulator is shown in FIG. 1. Phase shifters are used to modify the carrier phase applied to respective multiplier blocks so that the I channel phase is in quadrature with the Q channel phase. The modulators used may be any type of four-quadrant voltage controlled multipliers, but it is typical to use double balanced hybrid ring mixers or double balanced mixer ASICs for the function.

It is relatively simple to construct this subsystem if the carrier frequency is fixed or operates only over a limited frequency range. When operated over a wide range of frequencies the major problem is maintaining the quadrature relationship of the carrier at the input to the two modulators. Typical phase shift networks have either transmission line or reactive elements. In either approach phase is a strong function of frequency and circuit elements must be readjusted to maintain quadrature operation at each frequency if even modest results are to be obtained. Other, more broadband, phase shift networks, such as semi-infinite RC networks or 3 dB hybrid couplers, are sometimes used to increase the frequency range. While their outputs are relatively close to quadrature over one or more octaves, they too require circuit adjustment if excellent results are to be obtained.

Three of the best examples of prior art are U.S. Pat. Nos. 4,717,894, 5,119,399 and 5,694,093. The '894 patent combines the use of reference offset compensation, variable gain in the I and Q channels, calibrated I and Q sources and an RF detector to measure and adjust the I-Q modulator's operating parameters. This concept is extended slightly by the '399 patent. Both patents use a block diagram similar to FIG. 2. The calibration procedure is roughly as follows:

I and Q inputs are set to the zero position. The I and Q offsets are iteratively adjusted to null the Modulated Carrier Output signal as measured by the output detector.

The I input (only) is then connected to the voltage reference signal. The resulting signal is measured and compared with the result obtained when the voltage reference is connected to only the Q signal.

The variable gain is adjusted until the same signal amplitude is measured for each channel, alone, at the detector's terminal.

Phase is adjusted by applying the standard I and the standard Q signal simultaneously. The output signal amplitude is compared between when the polarity of the I signal is reversed.

The phase to the modulators is adjusted until the output signal amplitude is the same with either polarity of the I channel signal.

The '399 patent is differentiated from the '894 patent by using a more complicated system of reference voltages.

The '093 patent describes an I-Q GaAs modulator ASIC that adjusts itself for orthogonality over a 16:1 frequency range. The basic scheme is shown in FIG. 3. By using integrated circuit technology the values of the two capacitors C are created essentially equal. Likewise the two resistors R are essentially equal in value by using identical FET transistor circuits in each. The amplifier senses the detector outputs and adjusts the values of the resistors R until the output voltage from each detector is equal. This happens only when the value of the resistor R is equal to the reactance of the capacitor C at the operating frequency. At this value of resistance one network advances the carrier phase by 45° while the other retards it by 45°, thus bringing the two carrier signals into a quadrature relationship. The offset and gain parameters of this I-Q modulator are adjusted by similar schemes as shown in the previous patents with components external to the ASIC.

All three of these patents adjust the operation of an I-Q modulator by making only magnitude measurements of the resulting signal. What is desired is the ability to improve the adjustment of the operating parameters of the I-Q modulator by using the measurement of both amplitude and phase for a full waveform of the modulated carrier output.

BRIEF SUMMARY OF THE INVENTION

Accordingly the present invention provides a self-adjusting I-Q modulator system that has an I channel and a Q channel for a carrier signal, each channel having a phase shifter and multiplier in series. An I input and a Q input are applied respectively to the multipliers for mixing with the quadrature components of the carrier signal, the output from the multipliers being summed to provide a modulated carrier output. Each I and Q input path has a variable gain control and summer in series with the input to the respective multipliers, and has a variable offset voltage applied to the respective summers. The modulated carrier output is input to a waveform acquisition circuit for obtaining a full waveform from which both amplitude and phase measurements are obtained. Calibration occurs by setting the I and Q inputs to the multipliers to zero and adjusting the variable offset voltages to null the modulated carrier output. Then a voltage reference is selected by each I and Q input paths in turn, and the amplitude and phase of the modulated carrier output for each channel are measured. The phase shifters are adjusted to move the outputs of the phase shifters toward a quadrature relationship in response to the measured amplitude and phase of the full waveform. These steps are repeated until the phases of the I and Q channels are in quadrature. Finally the variable gain control in the I and Q input paths are adjusted to bring the outputs of the I and Q amplitudes in the modulated carrier output to equal amplitude. These steps are repeated each time the carrier frequency is changed.

The objects, advantages and other novel features of the present invention are apparent from the following detailed description when read in conjunction with the appended claims and drawing.

DETAILED DESCRIPTION OF THE INVENTION

Figure 1:
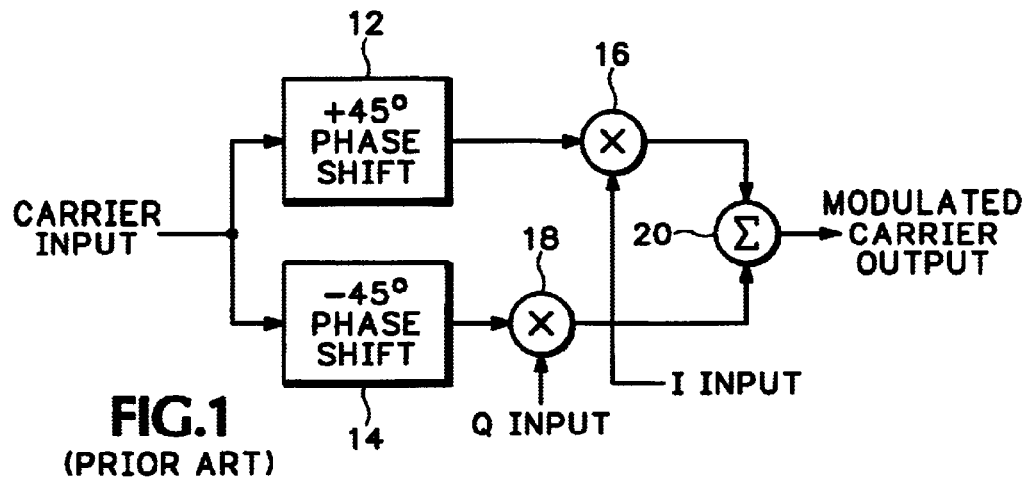
FIG. 1 is a basic block diagram view of an I-Q modulator system according to the prior art.
Figure 2:
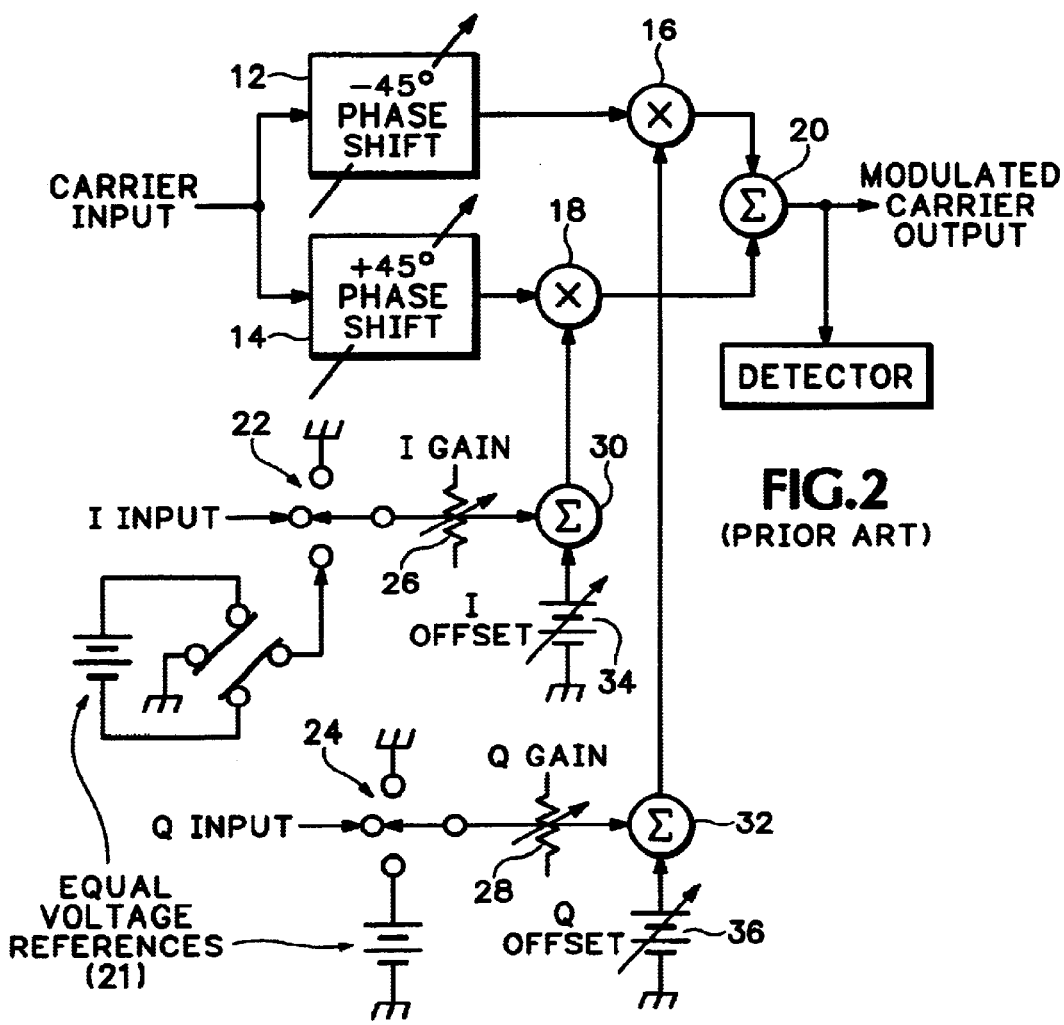
FIG. 2 is a block diagram view of another I-Q modulator system according to the prior art.
Figure 3:
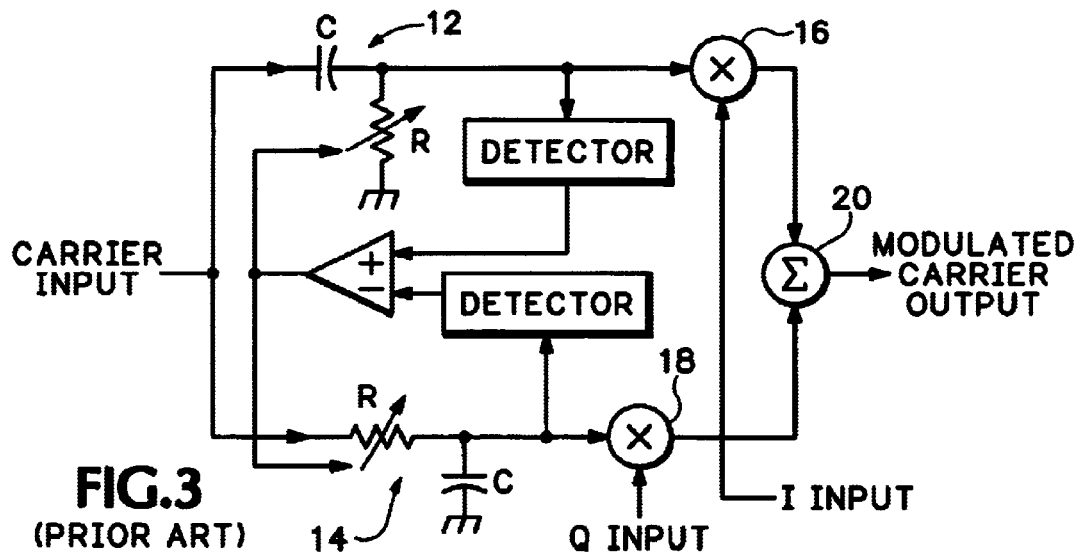
FIG. 3 is a block diagram view of yet another I-Q modulator system according to the prior art.
Figure 4:
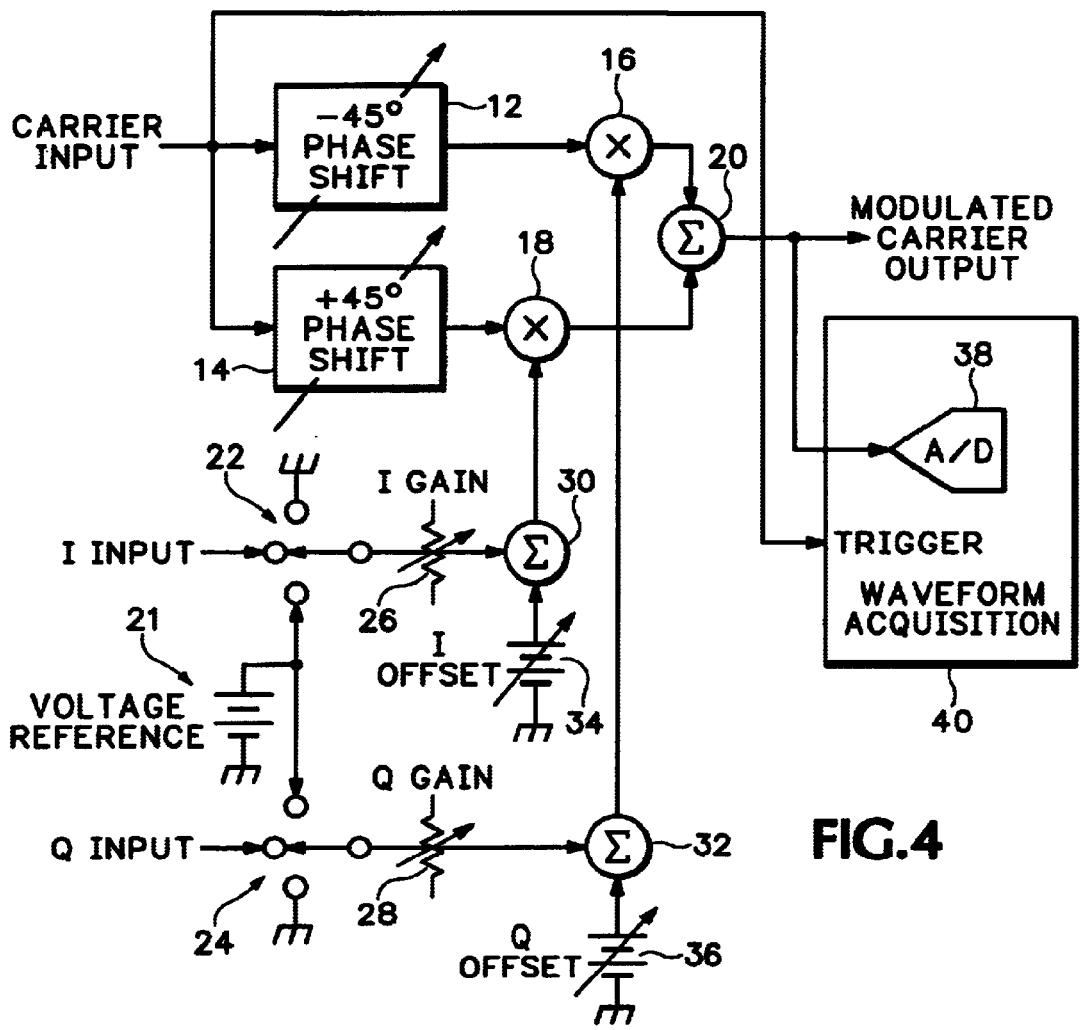
FIG. 4 is a block diagram view of a self-adjusting I-Q modulator system according to the present invention.

Referring now to FIG. 4 a carrier signal is input to both an I channel and a Q channel, each channel having a variable phase shifter 12, 14 and multiplier 16, 18 in series. The outputs of the multipliers 16, 18 are input to a summation circuit 20 to provide a modulated carrier output signal. I and Q data signals are input to respective switches 22, 24 having three positions—a common reference voltage 21 position, a signal position and a zero or ground position. The output from the switches 22, 24 are input to respective variable gain controls 26, 28, the outputs of which are input to respective summation circuits 30, 32. The other input to the I-Q summation circuits 30, 32 are respective variable offset voltages 34, 36. The outputs from the I-Q summation circuits 30, 32 are input to the respective I-Q channel multipliers 16, 18 for mixing with the respective phase shifted carrier signals.

A full waveform of the modulated carrier output is applied to an analog-digital A/D converter 38 in a waveform acquisition circuit 40 which uses well-known acquisition and digital signal processing DSP principles. The waveform acquisition circuit 40 is triggered by the carrier input signal. The adjustment sequence involves first setting the I and Q to zero by putting the switches 22, 24 in the zero or ground position and adjusting the offset voltages 34, 36 to null the modulated carrier output. Then the voltage reference 21 is selected by each channel in turn. The voltage reference 21 and the amplitude and phase of each channel is measured. Appropriate corrections are made to the phase shifters 12, 14 to move their outputs toward a quadrature relationship. This cycle is repeated until the phases of the I and Q channels are in quadrature. The variable gains 26, 28 in the I-Q input paths are then adjusted to bring the output of the I and Q signals to equal amplitude. This sequence is repeated each time the frequency is changed.

Thus the present invention provides a self-adjusting I-Q modulator system that measures not only magnitude data, but uses a full waveform of the modulated carrier output to adjust the phase as well.

What is claimed is:

1. An improved self-adjusting I-Q modulator system of the type having an I channel and a Q channel for a carrier signal, each channel having a phase shifter and multiplier in series with an I input and a Q input applied respectively to the multipliers for mixing with quadrature components of the carrier signal, the output from the multipliers being summed to provide a modulated carrier output, and each I and Q input having a variable gain control and summer in series with the input to the respective multipliers and having a variable offset voltage applied to the respective summers, the improvement comprising means for acquiring a waveform of the modulated carrier output triggered by the carrier signal so that both amplitude and phase of the modulated carrier output may be measured.

2. A method of adjusting an I-Q modulator system of the type having an I channel and a Q channel for a carrier signal, each channel having a phase shifter and multiplier in series with an I input and a Q input applied respectively to the multipliers for mixing with quadrature components of the carrier signal, the output from the multipliers being summed to provide a modulated carrier output, and each I and Q input having a variable gain control and summer in series with the input to the respective multipliers and having a variable offset voltage applied to the respective summers, comprising the steps of:

obtaining a full waveform of the modulated carrier output;

setting the I and Q inputs to zero and adjusting the variable offset voltages to null the modulated carrier output;

selecting a voltage reference by the I and Q input in turn and measuring the amplitude and phase of the full waveform for each channel;

adjusting the phase shifters to move the outputs of the phase shifters toward a quadrature relationship in response to the amplitude and phase of the selecting and measuring step;

repeating the selecting and measuring step and the adjusting step until the phases of the I and Q channels are In quadrature; and adjusting the variable gain control in the I and Q inputs to bring the outputs of the I and Q amplitudes in the modulated carrier output to equal amplitude.

3. The method as recited in claim 2 comprising the step of repeating all of the steps each time a frequency of the carrier signal is changed.

\* \* \* \* \*